United States Patent [19]

Shimizu et al.

[11] Patent Number: 4,590,672
[45] Date of Patent: May 27, 1986

[54] PACKAGE FOR ELECTRONIC DEVICE AND METHOD FOR PRODUCING SAME

[75] Inventors: Shokichi Shimizu, Kamakura; Hideji Aoki, Machida; Susumu Kida, Tokyo; Yuki Kanazawa, Yokohama, all of Japan

[73] Assignee: Fujitsu Limited, Kawasaki, Japan

[21] Appl. No.: 400,013

[22] Filed: Jul. 20, 1982

[30] Foreign Application Priority Data

Jul. 24, 1981 [JP] Japan .................. 56-115901

[51] Int. Cl.⁴ .................. H01R 43/00; H01L 23/48
[52] U.S. Cl. ...................... 29/827; 357/70;
428/596; 428/669; 428/670; 428/672;
174/50.61
[58] Field of Search .............. 29/827, 876; 174/68.5,
174/50.61, 52 FP; 204/43 G; 357/69, 70, 71,
73; 428/596, 669, 672, 673, 670, 681

[56] References Cited

U.S. PATENT DOCUMENTS

| 3,007,855 | 11/1961 | Ellwood | 29/876 X |
|---|---|---|---|
| 3,304,362 | 2/1967 | August | 174/50.61 X |
| 3,320,353 | 5/1967 | Smith | 174/50.61 X |
| 3,404,319 | 10/1968 | Tsuji et al. | 174/52 FP X |
| 3,484,533 | 12/1969 | Kauffman | 174/50.61 X |
| 3,585,075 | 6/1971 | Irvin et al. | 357/71 X |
| 3,647,712 | 3/1972 | Fritzinger et al. | 357/71 X |
| 3,686,080 | 8/1972 | Banfield et al. | 357/71 X |
| 3,729,820 | 5/1973 | Ihuchi et al. | 29/827 |
| 3,748,712 | 7/1973 | Karawin | 357/71 X |
| 3,765,970 | 10/1973 | Athanas et al. | 357/69 X |
| 3,878,554 | 4/1975 | Mikome | 357/71 X |
| 3,886,578 | 5/1975 | Eastwood et al. | 357/69 X |
| 3,932,880 | 1/1976 | Nara et al. | 357/71 X |
| 4,068,022 | 1/1978 | Glick | 357/71 X |
| 4,246,697 | 1/1981 | Smith | |
| 4,337,133 | 6/1982 | Augis et al. | 204/192 C |
| 4,358,350 | 11/1982 | Kunz | 204/43 G |

FOREIGN PATENT DOCUMENTS

| 96608 | 3/1973 | Fed. Rep. of Germany . | |
| 2306288 | 8/1973 | Fed. Rep. of Germany . | |
| 2159530 | 5/1980 | Fed. Rep. of Germany . | |
| 52-2170 | 8/1977 | Japan . | |
| 4127572 | 10/1979 | Japan | 357/71 |
| 940277 | 10/1963 | United Kingdom . | |
| 1166992 | 10/1969 | United Kingdom | 174/68.5 |
| 1206759 | 9/1970 | United Kingdom . | |
| 1315401 | 5/1973 | United Kingdom | 357/70 |

Primary Examiner—Howard N. Goldberg
Assistant Examiner—Carl J. Arbes
Attorney, Agent, or Firm—Staas & Halsey

[57] ABSTRACT

A package having an enclosure for accommodating an electronic device, and the process of producing same. The process comprises the steps of providing a lead frame which has at least a final layer electroplated on the outerlead area thereof; bonding an electronic device in the enclosure; connecting the electronic device with an innerlead area of the lead frame by means of wires; and, thereafter, sealing the enclosure with fused glass in such a manner that the outerlead area extends out of the glass.

9 Claims, 2 Drawing Figures

PACKAGE FOR ELECTRONIC DEVICE AND METHOD FOR PRODUCING SAME

BACKGROUND OF THE INVENTION

The present invention relates to a package for an electronic device, and more particularly to a package having such a structure with outerleads wherein at least a final layer is electroplated on the outerleads prior to glass-sealing.

Cer-dip type ceramic packages are widely used for electronic devices because of their lower production costs compared to multilayered ceramic type packages.

Cer-dip type ceramic packages have outer leads that are usually electroplated with tin or an alloy of tin and lead after sealing the package by means of fused glass. Such cer-dip type ceramic packages can be successfully assembled on a substrate by soldering. The outerleads, however, are liable to incompletely contact gold-electroplated sockets due to fretting corrosion. To prevent this, gold is often electroplated on the outerlead area.

Gold-electroplating after glass-sealing, however, results in several disadvantages. The sealing glass is chemically etched by the gold-electroplating bath. The surface of etched glass is chemically active and tends to be electroplated, even partly, with gold, which leads to an electric short-circuit between the outerleads. The glass dissolved by the etching, further, contaminates the electroplating bath and shortens its service life.

SUMMARY OF THE INVENTION

It is an object of the present invention to provide a process of producing a package for an electronic device having at least a final layer on the outerleads which layer is capable of completely contacting gold-electroplated sockets.

It is another object of the present invention to provide a process of producing a package for an electronic device, wherein at least a final layer is electroplated on the outerleads without affecting the sealing glass.

Other objects and advantages of the present invention will become apparent hereafter.

DETAILED DESCRIPTION OF THE PREFERRED EMBODIMENTS

Figure 1:
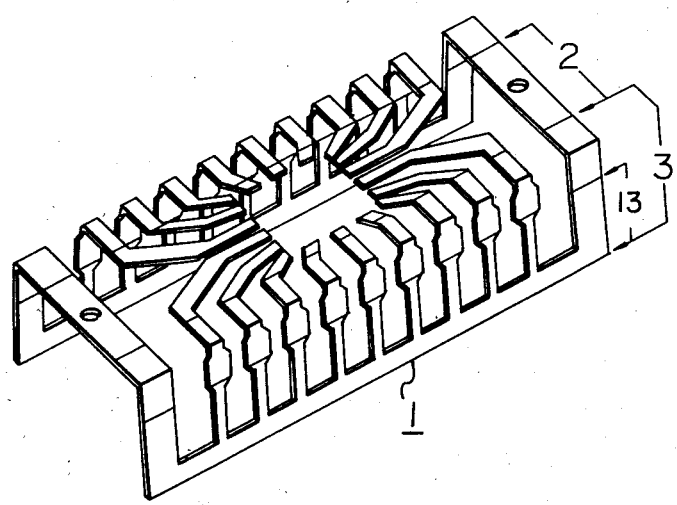
FIG. 1 is a perspective view of a lead frame for packaging an electronic device.
Figure 2:
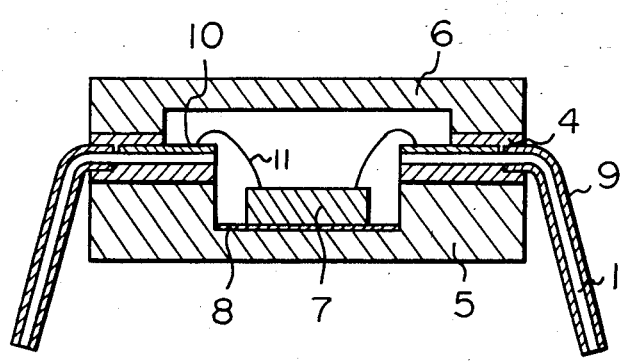
FIG. 2 is a sectional view of a cer-dip type ceramic package for an electronic device.

As shown in FIG. 1, lead frame 1 comprises innerlead area 2 and outerlead area 3. Lead frame 1 is commonly made of an alloy of iron and nickel. Referring to FIG. 2, lead frame 1 is fixed to the package for an electronic device by embedding its innerlead area 2 in fused glass 4, which seals ceramic substrate 5 and ceramic lid 6 of the package. Electronic device 7 is bonded on ceramic substrate 55 via metallized layer 8, e.g., of gold. Device 7 is connected by means of aluminum wire 11 with innerlead area 2 claded with aluminum 10. Outerlead area 3 extends out of fused glass 4.

According to one aspect of the present invention, there is provided a process of producing a package having an enclosure for accomodating an electronic device, comprising the steps of:

providing a lead frame which has at least a final layer electroplated on the outerlead area thereof;

bonding the electronic device in the enclosure;

connecting said electronic device with an innerlead area of said lead frame by means of wires; and thereafter, sealing the enclosure with fused glass in such a manner that said outerlead area extends out of said glass.

According to another aspect of the present invention, there is provided a lead frame for packaging an electronic device, having at least a final layer electroplated with gold or silver on the outerlead area of said lead frame.

According to still another aspect of the present invention, there is provided a package for an electronic device, having outerleads on which at least a final layer is electroplated with gold or silver, which layer extends within the fused glass.

It is advantageous that said process of producing a package for an electronic device comprise the step of electroplating a layer of a metal selected from the platinum group metals as an underplate for said final layer on said outerlead area of said lead frame and the step of electroplating, thereafter, a layer of gold or silver as a final layer on said underplate.

It is also preferable that said process of producing a package for an electronic device comprise the step of electroplating said final layer with gold or silver only on a portion of the outerlead area, in the case where said underplate layer extends within the fused glass. Such an underplate of a metal selected from the platinum group metals can prevent oxidation of the lead frame.

It is advisable that said lead frame for packaging an electronic device comprise said final layer having an underplate electroplated with a metal selected from the platinum group metals.

It is preferable that said package for an electronic device comprise said final layer having an underplate electroplated with a metal selected from the platinum group metals.

According to the present invention, at least a final layer is electroplated on the surface of the lead frame prior to thermally sealing with glass the enclosure accommodating the electronic device. Therefore, the process of producing a package according to the present invention dispenses with the wet process of electroplating, otherwise required after sealing the enclosure. This significantly improves the reliability and productivity of a package for an electronic device. Further, in the case where an underplate is electroplated with a metal selected from the platinum group metals, the thickness of the final layer of gold or silver can be reduced to about one-third the thickness required in the case where the layer is only gold or silver.

The lead frame, the package for an electronic device, and the process of producing the same according to the present invention may be more fully understood from the following examples, offered by way of illustration and not by way of limitation.

Outerlead area 3 (FIG. 1) is electroplated with gold of 3 to 5 $\mu$m thickness as a final layer 9 on a layer of nickel of 1.0 to 3.0 $\mu$m thickness. This final layer 9 of gold can prevent thermal diffusion of the base metal during glass sealing of the enclosure, so that the gold does not exhibit a change in color.

The thickness of gold of the final layer 9 can be further reduced as described in the following example. Outerlead area 3 is sequentially electroplated with nickel of 0.2 to 1.0 μm thickness, with gold of 0.1 to 0.2 μm thickness, with rhodium of 0.2 to 0.5 μm thickness, and finally with gold of 0.5 to 1.5 μm thickness. The underplate of rhodium acts as a barrier against thermal diffusion of the base metal, thus the relatively thin layer of gold does not exhibit a change in color after packaging.

In addition, a gold-electroplated layer of excellent appearance may be obtained by preventing permeation of the electroplating liquid through the gap between the lead frame and the masking jig. This may be done by depressing the portion of the lead frame to be masked with the jig.

As another example, all the metals shown in the above-described example except the final layer 9 are electroplated on the entire area of outerlead area 3. Then, the area of the final layer 9 of gold is reduced to that only covering an end portion 13 (FIG. 1), which is about one half of the entire outerlead area 3.

This reduction of the thickness and area of the final layer of the electroplated gold can reduce the production costs of a lead frame and, consequently, of a package for an electronic device having leads produced of such a lead frame.

We claim:

1. A process of producing a package having an enclosure for accommodating an electronic device, comprising the steps of:
    electroplating a layer of a metal selected from the platinum group metals as an underplate on the outerlead area of an iron and nickel-containing alloy lead frame, excluding the end portion of the innerlead area thereof;
    electroplating a layer of gold or silver as a final layer on said underplate;
    bonding said electronic device in the enclosure;
    connecting said electronic device with said end portion of the innerlead area by means of wires; and
    thereafter, sealing the enclosure with fused glass in such a manner that said outerlead area of said lead frame extends out of said glass.

2. A process according to claim 1, wherein said underplate is a layer electroplated with rhodium.

3. The process of claim 1, wherein said underplate extends within said glass and the final layer of gold or silver is electroplated only on an end portion of the outerlead area of the lead frame.

4. An iron and nickel-containing alloy lead frame for a package of an electronic device, comprising an innerlead area for locating within the package and an outerlead area for locating outside of the package said outerlead area having at least a final layer electroplated with gold or silver on an underplate which is electroplated with a metal selected from the platinum group metals on said outerlead area, excluding the end portion of said innerlead area.

5. A lead frame according to claim 4, wherein said underplate is a layer electroplated with rhodium.

6. The lead frame of claim 4, wherein the outerlead area has only an end portion electroplated with the final layer of gold or silver.

7. A package for an electronic device, comprising an iron and nickel-containing alloy lead frame of which outerleads have at least a final layer electroplated with gold or silver and of which innerleads are partially embedded in glass, said final layer on the outerleads extending within the glass, said final layer having an underplate which is electroplated with a metal selected from the platinum group metals on said outerleads, excluding the end portion of said innerleads, said underplate extending within the glass.

8. A package according to claim 7, wherein said underplate is a layer electroplated with rhodium.

9. A package according to claim 7, wherein the final layer of gold or silver is electroplated only on an end portion of the outerleads.

* * * * *